(12) United States Patent
Watanabe et al.

(10) Patent No.: US 10,910,215 B2
(45) Date of Patent: Feb. 2, 2021

(54) METHOD OF FORMING LATER INSULATING FILMS FOR MTJ

(71) Applicant: TOKYO ELECTRON LIMITED, Tokyo (JP)

(72) Inventors: Naoki Watanabe, Nirasaki (JP); Tatsuo Hatano, Nirasaki (JP); Shinji Furukawa, Nirasaki (JP); Naoyuki Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/639,682

(22) Filed: Jun. 30, 2017

(65) Prior Publication Data

US 2018/0012756 A1  Jan. 11, 2018

(30) Foreign Application Priority Data

Jul. 5, 2016 (JP) ................................. 2016-133531

(51) Int. Cl.
*H01L 21/02* (2006.01)
*C23C 14/56* (2006.01)
(Continued)

(52) U.S. Cl.
CPC .... *H01L 21/02225* (2013.01); *C23C 14/3464* (2013.01); *C23C 14/505* (2013.01); *C23C 14/568* (2013.01); *H01L 21/28061* (2013.01); *H01L 21/28202* (2013.01); *H01L 43/12* (2013.01)

(58) Field of Classification Search
CPC ........... H01L 21/02263; H01L 21/0226; H01L 21/02266; H01L 21/0217; H01L 21/67; H01L 21/0228; H01L 21/3065–30655; H01L 21/31116; H01L 21/31122; H01L 21/31138; H01L 21/67069; H01L 21/32136–32137; H01L 21/02071; C23C 16/54–545; C23C 16/5096; C23C 14/3407–3428; C23C 14/56; C23C 14/562; C23C 14/505; C23C 14/35; C23C 14/568

See application file for complete search history.

(56) References Cited

U.S. PATENT DOCUMENTS 7,594,970 B2 *  9/2009  Hein ...................... C23C 14/562
                                                         118/718
10,711,349 B2 *  7/2020  Fiedler .................... C23C 16/54
(Continued)

FOREIGN PATENT DOCUMENTS

JP    11-158616 A    6/1999
JP    2007-157221 A  6/2007
(Continued)

*Primary Examiner* — Allen L Parker
*Assistant Examiner* — Gustavo G Ramallo
(74) *Attorney, Agent, or Firm* — Nath, Goldberg & Meyer; Jerald L. Meyer

(57) ABSTRACT

There is provided a method of forming an insulating film which includes providing a workpiece having a base portion and a protuberance portion formed to protrude from the base portion; and forming an insulating film on the workpiece by sputtering. The forming an insulating film includes forming the insulating film while changing an angle defined between the workpiece and a target.

5 Claims, 10 Drawing Sheets

(51) Int. Cl.
  *C23C 14/50* (2006.01)
  *C23C 14/34* (2006.01)
  *H01L 43/12* (2006.01)
  *H01L 21/28* (2006.01)

(56) References Cited

U.S. PATENT DOCUMENTS

| | | | | |
|---|---|---|---|---|
| 2003/0228710 | A1* | 12/2003 | Drewes | H01F 10/3254 |
| | | | | 438/3 |
| 2004/0052131 | A1* | 3/2004 | Komuro | B82Y 10/00 |
| | | | | 365/202 |
| 2004/0226827 | A1* | 11/2004 | Matsuda | C25D 5/02 |
| | | | | 205/123 |
| 2004/0233757 | A1* | 11/2004 | Maesaka | B82Y 10/00 |
| | | | | 365/222 |
| 2007/0127165 | A1* | 6/2007 | Kanaya | B82Y 10/00 |
| | | | | 360/324.1 |
| 2010/0078309 | A1* | 4/2010 | Ueda | C23C 14/352 |
| | | | | 204/192.1 |
| 2010/0155229 | A1* | 6/2010 | Endo | C23C 14/042 |
| | | | | 204/192.12 |
| 2010/0193132 | A1* | 8/2010 | Wi | H01L 21/6719 |
| | | | | 156/345.51 |
| 2013/0078823 | A1* | 3/2013 | Takeshima | H01L 21/68771 |
| | | | | 438/799 |
| 2013/0126995 | A1* | 5/2013 | Ogihara | H01L 27/222 |
| | | | | 257/421 |

FOREIGN PATENT DOCUMENTS

| | | | |
|---|---|---|---|
| JP | 2008-013817 A | 1/2008 | |
| JP | 2009-253303 A | 10/2009 | |
| JP | 2015-529744 A | 10/2015 | |

* cited by examiner

US 10,910,215 B2

METHOD OF FORMING LATER INSULATING FILMS FOR MTJ

CROSS-REFERENCE TO RELATED APPLICATION

This application claims the benefit of Japanese Patent Application No. 2016-133531, filed on Jul. 5, 2016, in the Japan Patent Office, the disclosure of which is incorporated herein in its entirety by reference.

TECHNICAL FIELD

The present disclosure relates to a method of forming an insulating film.

BACKGROUND

A magneto-resistive random access memory (MRAM) has been developed as a magneto-resistive element having a magnetic tunnel junction (MTJ) element region. The MTJ element region includes a first magnetic layer, a second magnetic layer and an insulating layer interposed between the first magnetic layer and the second magnetic layer.

In manufacturing such a magneto-resistive element, a laminated body constituted by the first magnetic layer, the second magnetic layer and the insulating layer is subjected to a plasma etching to form a columnar portion including the MTJ element region. Thereafter, in order to prevent the columnar portion from being oxidized due to exposure to the atmosphere, an insulating film is formed on the surface of the columnar portion. A film formed of silicon nitride is used as the insulating film. The insulating film may be formed by, for example, a physical deposition method such as sputtering.

In the manufacture of an electronic device, an insulating film is sometimes formed on the surface of a protuberance portion such as the columnar portion including the MTJ element region described above. The insulating film needs to be formed sufficiently not only on the upper surface but also on lateral surfaces of the protuberance portion. That is to say, the insulating film is required to be formed with good coverage. However, in the sputtering, the insulating film is formed mainly on the upper surface of the protuberance portion but is not formed sufficiently on the lateral surfaces.

SUMMARY

Some embodiments of the present disclosure provide an insulating film forming method capable of forming an insulating film on a protuberance portion with good coverage.

According to one embodiment of the present disclosure, there is provided a method of forming an insulating film, which includes: providing a workpiece having a base portion and a protuberance portion formed to protrude from the base portion; and forming an insulating film on the workpiece by sputtering, wherein the forming an insulating film includes forming the insulating film while changing an angle defined between the workpiece and a target.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
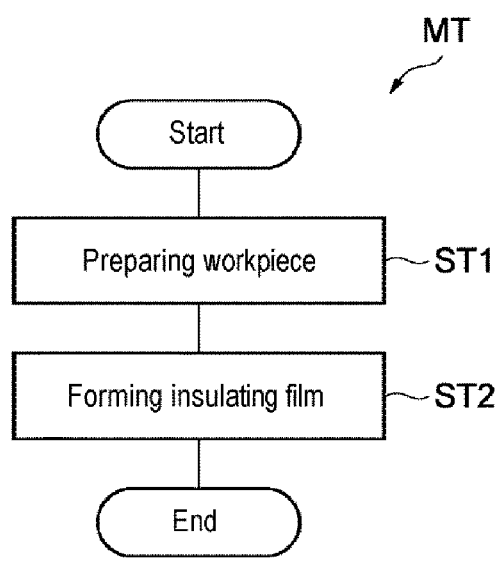
FIG. 1 is a flowchart showing an insulating film forming method according to one embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Throughout the drawings, the same or equivalent parts or portions are denoted by the same reference numerals.

FIG. 1 is a flowchart showing an insulating film forming method according to an embodiment. The method MT shown in FIG. 1 is to form an insulating film on a surface of a protuberance portion of a workpiece. In one embodiment, the method MT is used in manufacturing a magneto-resistive element and is carried out to form an insulating film on a surface of a columnar portion including a magnetic tunnel junction (MTJ) element region.

Figure 2:
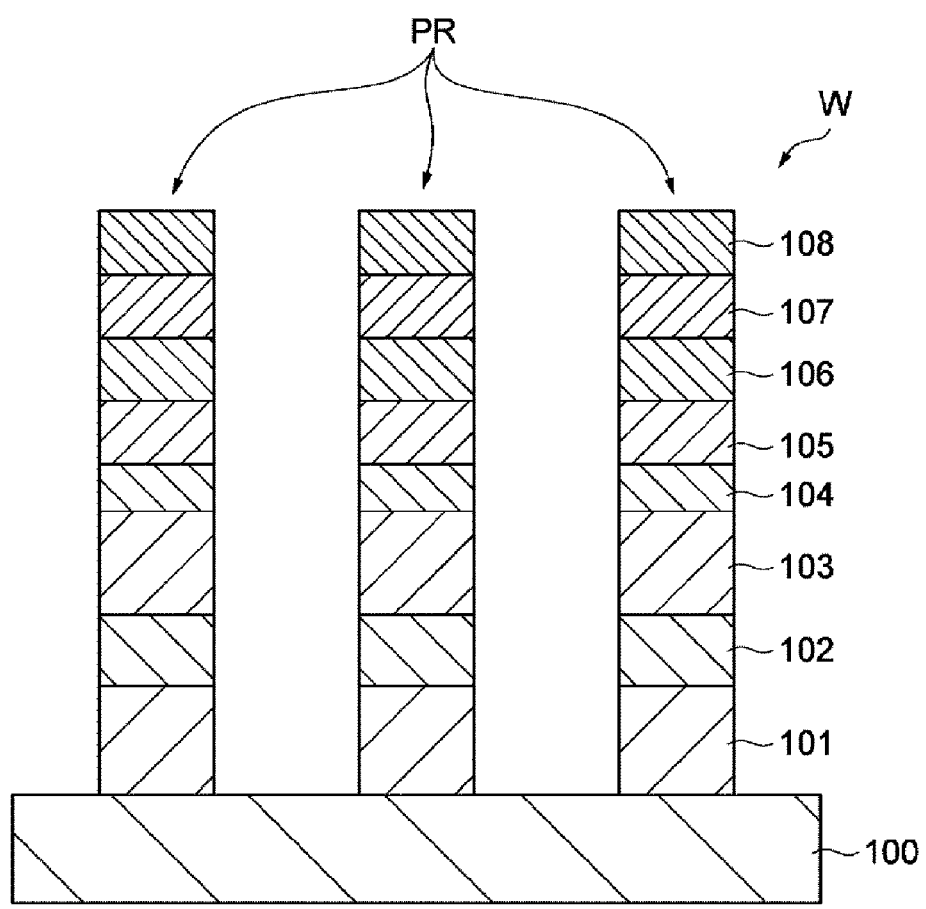
FIG. 2 is an enlarged sectional view of an example of a workpiece to which the method shown in FIG. 1 is applied.

The method MT starts from step ST1. In step ST1, a workpiece is prepared. In step ST1 of one embodiment, the workpiece is accommodated in a chamber of a processing apparatus for sputtering. FIG. 2 is an enlarged sectional view of an example of a workpiece to which the method shown in FIG. 1 is applied.

The workpiece W shown in FIG. 2 may have, for example, a disc shape. The workpiece W includes a substrate 100, a lower electrode layer 101, an underlying layer 102, an antiferromagnetic layer 103, a spacer layer 104, a first magnetic layer 105, an insulating layer 106, a second magnetic layer 107 and a cap layer 108. The substrate 100 is made of, e.g., silicon. The lower electrode layer 101 is formed on the substrate 100. The lower electrode layer 101 is made of, e.g., ruthenium (Ru). The underlying layer 102 is formed on the lower electrode layer 101. The underlying layer 102 is made of, e.g., tantalum (Ta). The antiferromagnetic layer 103 is formed on the underlying layer 102. The antiferromagnetic layer 103 may have a multilayer structure including, for example, cobalt (Co) layers and platinum (Pt) layers alternately laminated. The spacer layer 104 is formed on the antiferromagnetic layer 103. The spacer layer 104 is made of, e.g., ruthenium (Ru).

The first magnetic layer 105 is formed on the spacer layer 104. The first magnetic layer 105 constitutes a reference layer and is made of, e.g., cobalt (Co), iron (Fe) and boron (B). The insulating layer 106 constitutes a barrier layer and is formed on the first magnetic layer 105. The insulating layer 106 is made of an insulating member such as magnesium oxide or aluminum oxide. The second magnetic layer 107 constitutes a free layer and is formed on the insulating layer 106. The second magnetic layer 107 is made of, e.g., cobalt (Co), iron (Fe) and boron (B). The first magnetic layer 105, the insulating layer 106 and the second magnetic layer 107 constitute a magnetic tunnel junction element region. The cap layer 108 is formed on the second magnetic layer 107. The cap layer 108 is made of, e.g., tantalum (Ta).

Figure 3:
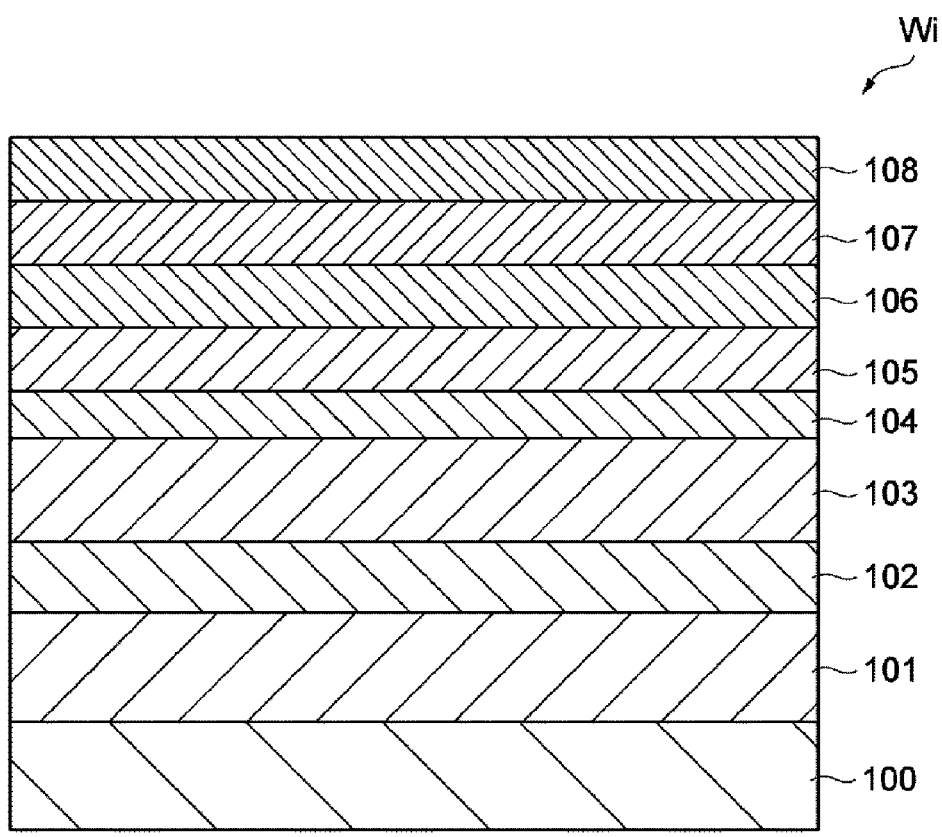
FIG. 3 is an enlarged sectional view of an example of a workpiece in a state before the application of the method shown in FIG. 1.

The workpiece W has a plurality of protuberance portions PR. The plurality of protuberance portions PR protrude from the surface of the substrate 100, namely a base portion, and have a columnar shape. Each of the plurality of protuberance portions PR includes the lower electrode layer 101, the underlying layer 102, the antiferromagnetic layer 103, the spacer layer 104, the first magnetic layer 105, the insulating layer 106, the second magnetic layer 107 and the cap layer 108 as described above. FIG. 3 is an enlarged sectional view of an example of a workpiece in a state before the application of the method shown in FIG. 1. A workpiece Wi shown in FIG. 3 includes a lower electrode layer 101, an underlying layer 102, an antiferromagnetic layer 103, a spacer layer 104, a first magnetic layer 105, an insulating layer 106, a second magnetic layer 107 and a cap layer 108. The workpiece W may be obtained by applying a photolithography and a plasma etching with respect to the workpiece Wi to form the plurality of protuberance portions PR.

Figure 4:
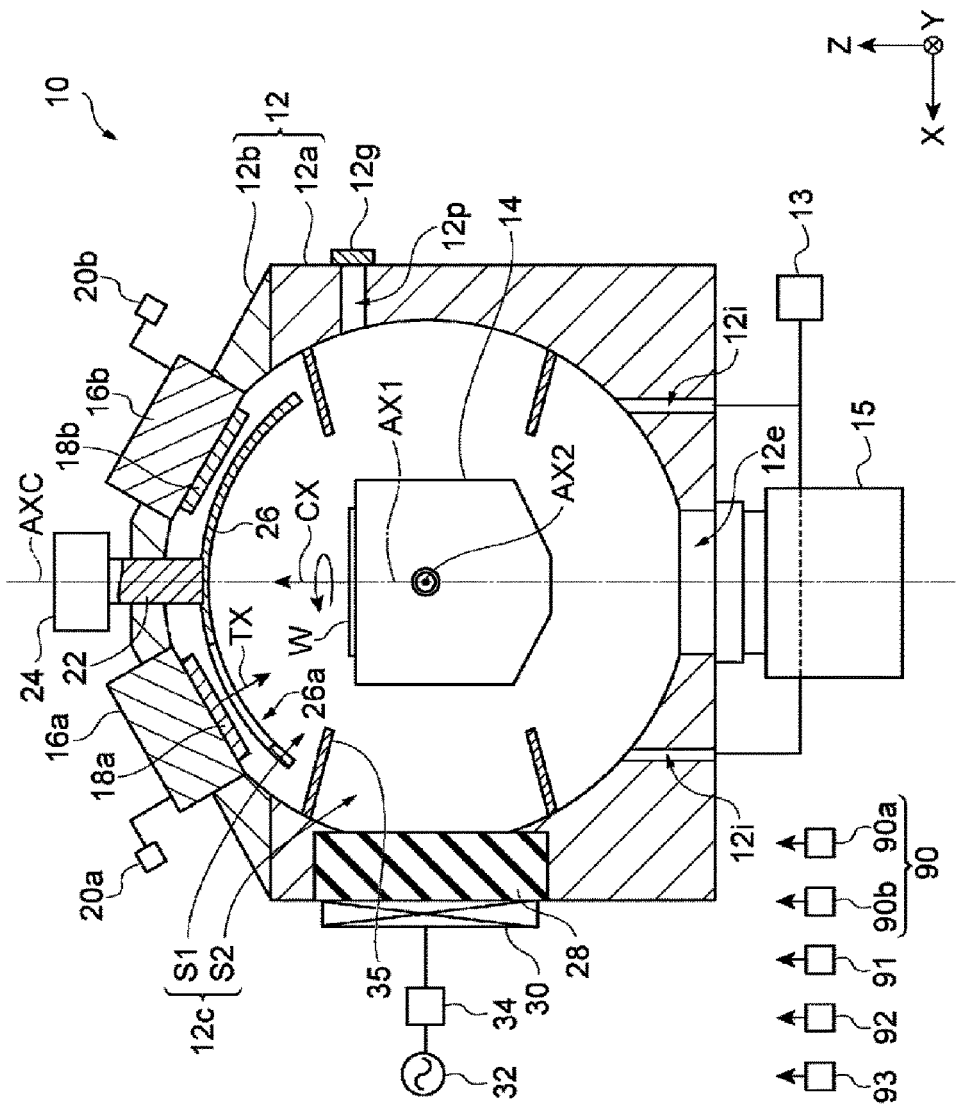
FIG. 4 is a view schematically showing a processing apparatus that can be used to carry out the method shown in FIG. 1.

As described above, in the step ST1 of the method MT, the workpiece W is accommodated in the chamber of the processing apparatus for sputtering. FIG. 4 is a view schematically showing a processing apparatus that can be used to carry out the method shown in FIG. 1. A processing apparatus 10 shown in FIG. 4 includes a chamber body 12 and a mounting table 14.

The chamber body 12 includes an internal space defined as a chamber 12c. The chamber 12c is, for example, a substantially spherical space, but is not limited thereto. The chamber body 12 is formed of, for example, metal such as aluminum, and is grounded. Further, a coating such as an alumite film is applied to an inner wall surface of the chamber body 12. In one embodiment, the chamber body 12 includes a main portion 12a and a cover portion 12b. The cover portion 12b is installed on the main portion 12a and is configured to be attachable to and detachable from the main portion 12a.

An opening 12p through which the aforementioned workpiece W is loaded into or unloaded from the chamber 12c is formed in the sidewall portion of the chamber body 12. The opening 12p is configured to be opened and closed by a gate valve 12g.

Further, a gas supply part 13 is connected to the chamber body 12. The gas supply part 13 is configured to supply a gas to the chamber 12c. The gas supply part 13 may include a gas source, a flow rate controller such as a mass flow controller, and an opening/closing valve. The gas source is a source of a nitrogen gas. The gas supply part 13 may further include a source of a noble gas such as an argon gas. The gas source of the gas supply part 13 is coupled to the chamber 12c via the flow rate controller and the opening/closing valve. The gas supply part 13 is connected to gas introduction paths 12i installed in a bottom portion of the chamber body 12.

In addition, an exhaust device 15 is connected to the chamber body 12. The exhaust device 15 may include a pressure regulating valve and a vacuum pump such as a turbo molecular pump. In one embodiment, the exhaust device 15 is connected to an exhaust hole 12e formed in the center of the bottom portion of the chamber body 12.

The mounting table 14 is installed inside the chamber 12c. The chamber 12c includes a first space S1 and a second space S2. The first space S1 and the second space S2 are arranged in a circumferential direction with respect to a second axis line AX2 of the mounting table 14 which will be described later. In one embodiment, the first space S1 is provided above the mounting table 14 (in a Z direction), and the second space S2 is provided in a horizontal direction (X direction) with respect to the mounting table 14.

The first space S1 is a space for film formation. In one embodiment, a target holder 16a and a target holder 16b are installed above the first space S1. The target holder 16a and the target holder 16b are installed in the cover portion 12b. The target holder 16a and the target holder 16b are formed of conductors and electrically separated (insulated) from the cover portion 12b. The target holder 16a holds a target 18a at the first space S1 side. The target holder 16b holds a target 18b at the first space S1 side. The target 18a is formed of, for example, silicon. The target 18b is formed of, for example, aluminum. A power supply 20a is connected to the target holder 16a. Further, a power supply 20b is connected to the target holder 16b. The power supply 20a and the power supply 20b may be DC power supplies or high-frequency power supplies.

In one embodiment, the target holder 16a and the target holder 16b are disposed symmetrically with respect to a central axis line AXC. The central axis line AXC is an axis line extending in a vertical direction (Z direction), and corresponds a central axis line of the chamber 12c. In the processing apparatus 10, the target 18a held by the target holder 16a and the target 18b held by the target holder 16b are also disposed symmetrically with respect to the central axis line AXC. Further, the target holder 16a holds the target 18a such that the target 18a is inclined with respect to the central axis line AXC and the target holder 16b holds the target 18b such that the target 18b is inclined with respect to the central axis line AXC.

In addition, in the processing apparatus 10, a shaft body 22 is installed to penetrate the cover portion 12b along the central axis line AXC. A rotation driving device 24 (e.g., a motor) is connected to the shaft body 22 installed outside the chamber body 12. A shutter 26 is coupled to the shaft body 22 inside the chamber body 12, i.e., in the first space S1. The shutter 26 is arranged between the targets 18a and 18b and the mounting table 14. An opening 26a for allowing the target 18a or the target 18b to be exposed to the mounting table 14 is formed in the shutter 26. A position of the opening 26a of the shutter 26 in a rotational direction with respect to the central axis line AXC is adjusted by the rotation driving device 24. It is therefore possible to selectively expose one of the target 18a and the target 18b with respect to the mounting table 14. Further, it is possible to block both the target 18a and the target 18b from the mounting table 14 with the shutter 26.

In the processing apparatus 10, an opening is formed at the side of the second space S2 in the chamber body 12. This opening is closed by a window member 28. The window member 28 is formed of a dielectric material such as quartz. Further, an antenna (coil) 30 is installed to face the window member 28 outside the chamber body 12. A high-frequency power supply 32 is coupled to the antenna 30 via a matcher 34. The high-frequency power supply 32 supplies a high frequency to the antenna 30 in order to excite a gas supplied from the gas supply part 13 into the chamber 12c. The matcher 34 is equipped with a matching circuit for matching output impedance of the high-frequency power supply 32 and a load, i.e., impedance of the chamber body 12 side. In the processing apparatus 10, the high-frequency power supply 32 and the antenna 30 constitute an inductively coupled plasma generating part.

In one embodiment, the processing apparatus 10 further includes a partition wall 35. The partition wall 35 extends from the chamber body 12 into the chamber 12c, and is installed between the first space S and the second space S2. The partition wall 35 suppresses a substance released from the target 18a or the target 18b from entering the second space S2. Further, the partition wall 35 suppresses active species generated in the second space S2 from entering the first space S1. In addition, the partition wall 35 may be appropriately installed inside the chamber 12c such that, for example, each of the first space S1 and the second space S2 are partitioned with an appropriate volume.

Figure 5:
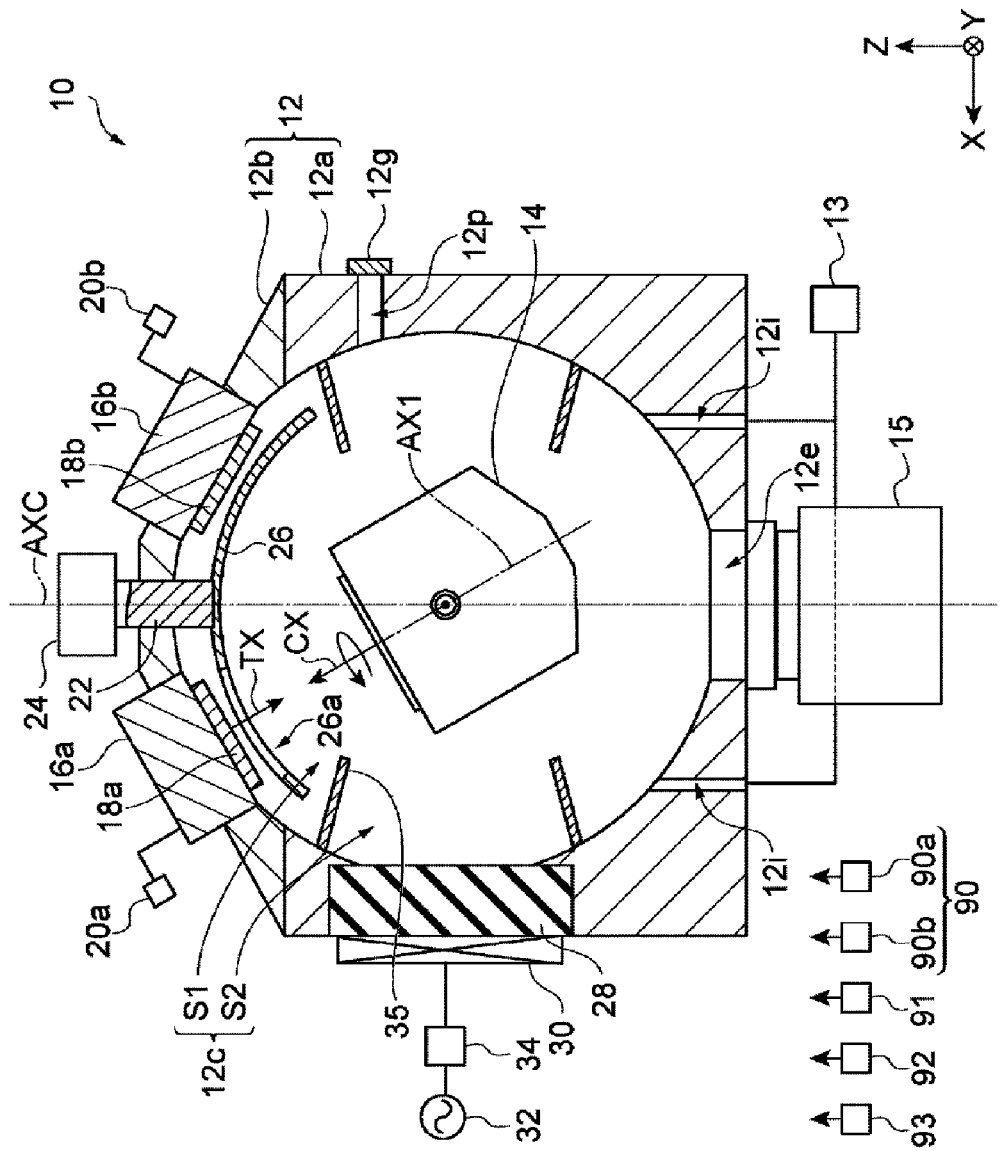
FIG. 5 is a view schematically showing a processing apparatus that can be used to carry out the method shown in FIG. 1.
Figure 6:
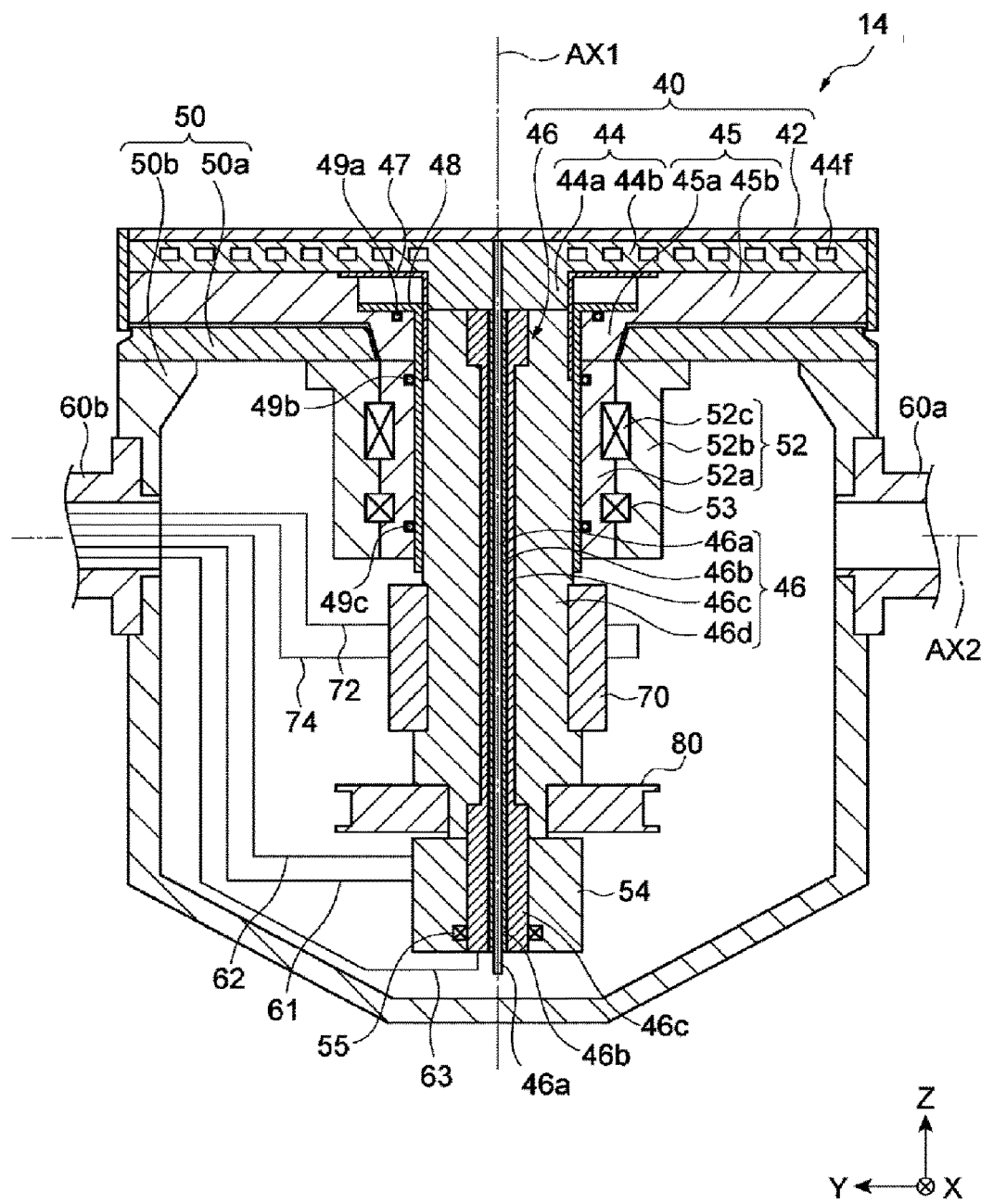
FIG. 6 is a sectional view of a mounting table of the processing apparatus shown in FIG. 4.
Figure 7:
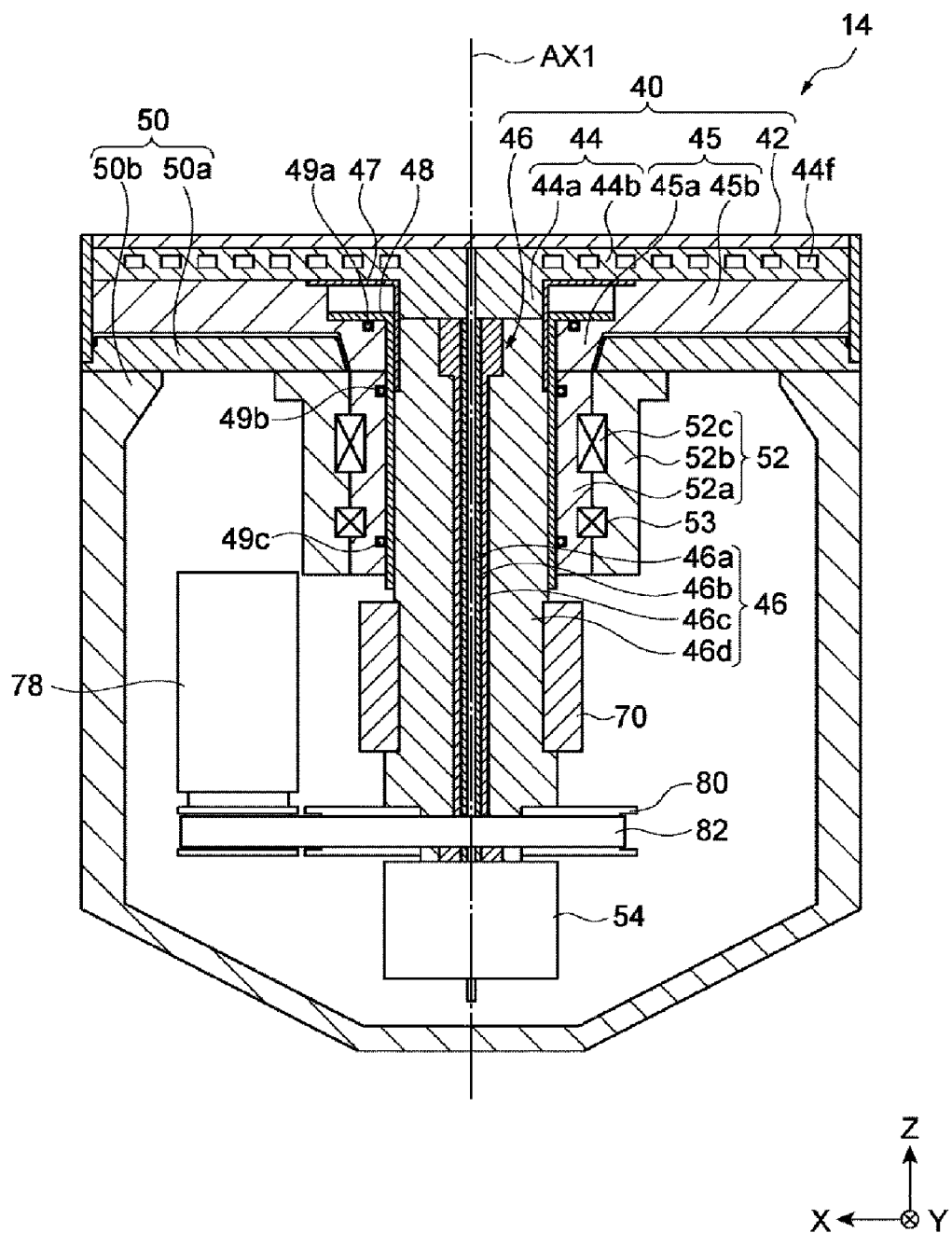
FIG. 7 is a sectional view of a mounting table of the processing apparatus shown in FIG. 4.

Next, the mounting table 14 will be described in detail. FIG. 5 is a view schematically showing a processing apparatus that can be used to carry out the method shown in FIG. 1. In FIG. 5, the mounting table 14 is illustrated as being obliquely disposed by rotating about the second axis line AX2 from the state illustrated in FIG. 4. FIGS. 6 and 7 are cross sectional views of the mounting table of the processing apparatus illustrated in FIG. 4. Hereinafter, FIGS. 4 to 7 will be referred to.

The mounting table 14 is a mechanism configured to hold the workpiece W. The mounting table 14 holds the workpiece W such that a central axis line CX of the workpiece W is aligned with a first axis line AX1. The central axis line CX includes the center of the workpiece W and is parallel to a direction in which the protuberance portions PR of the workpiece W extend. The mounting table 14 is configured to rotate the workpiece W around the first axis line AX1.

The mounting table 14 is configured to be rotated around the above-described second axis line AX2 orthogonal to the first axis line AX1. The second axis line AX2 extends in a direction (Y direction) orthogonal to the vertical direction (Z direction). When an angular position around the second axis line AX2 of the mounting table 14 is set so that the workpiece W faces the first space S1, a film can be formed on the workpiece W. Further, when an angular position around the second axis line AX2 of the mounting table 14 is set so that the workpiece W faces the second space S2, the workpiece W can be etched.

As shown in FIGS. 4 and 5, the mounting table 14 can be rotated around the second axis line AX2 within a predetermined angular range in a state where the workpiece W faces the first space S1. That is to say, the mounting table 14 can be changed in terms of an angle defined between the workpiece W and the target 18a or the target 18b in a state where the workpiece W faces the first space S1. More specifically, in the state where the workpiece W faces the first space S1, the mounting table 14 can be changed in terms of an angle defined between a direction TX which the target 18a faces (or a direction which the target 18b faces) and a direction in which the central axis line CX of the workpiece W extends.

As illustrated in FIGS. 6 and 7, the mounting table 14 includes a holding part 40, a vessel 50, and a pair of shaft parts 60a and 60b. The holding part 40 is configured to hold the workpiece W. Further, the holding part 40 is configured to rotate about the first axis line AX1 as its central axis line so as to rotate the workpiece W. The holding part 40 includes an electrostatic chuck 42, a lower electrode 44, a shaft part 46, and an insulating member 45.

The electrostatic chuck 42 is configured to hold the workpiece W on its upper surface. The electrostatic chuck 42 has a substantially disc shape. A central axis line of the electrostatic chuck 42 is aligned with the first axis line AX1. The electrostatic chuck 42 includes an electrode film formed as an inner layer of the insulation film. The electrostatic chuck 42 generates an electrostatic force based on a voltage applied to the electrode film. By virtue of the electrostatic force, the electrostatic chuck 42 adsorbs and holds the workpiece W placed thereon. In some embodiments, a heat transfer gas such as an He gas or an Ar gas may be supplied between the electrostatic chuck 42 and the workpiece W. Further, a heater for heating the workpiece W may be embedded in the electrostatic chuck 42. The electrostatic chuck 42 is installed on the lower electrode 44.

The lower electrode 44 has a substantially disc shape. A central axis line of the lower electrode 44 is aligned with the first axis line AX1. In one embodiment, the lower electrode 44 includes a first portion 44a and a second portion 44b. The first portion 44a is a central portion of the lower electrode 44 extending along the first axis line AX1. The second portion 44b is a portion that is further spaced apart from the first axis line AX1 than the first portion 44a, i.e., a portion extending outward of the first portion 44a.

An upper surface of the first portion 44a and an upper surface of the second portion 44b are coplanar. A substantially flat upper surface of the lower electrode 44 is formed by the upper surface of the first portion 44a and the upper surface of the second portion 44b. The electrostatic chuck 42 is installed on the upper surface of the lower electrode 44. Further, the first portion 44a protrudes downward relative to the second portion 44b and has a cylindrical shape. That is to say, a lower surface of the first portion 44a extends downward relative to a lower surface of the second portion 44b.

The lower electrode 44 is made of a conductor such as aluminum or stainless steel. The lower electrode 44 is electrically connected to a bias power supply part 90 (see FIG. 4) installed outside the chamber body 12. The bias power supply part 90 includes a first power supply 90a and a second power supply 90b. The first power supply 90a is configured to generate a pulse-modulated DC power (a modulated DC voltage). The second power supply 90b is configured to generate a high frequency for biasing. The modulated DC voltage generated from the first power supply 90a and the high frequency generated from the second power supply 90b are selectively supplied to the lower electrode 44.

A flow passage 44f is formed in the lower electrode 44. A refrigerant is supplied to the flow passage 44f. As the refrigerant is supplied to the flow passage 44f, the temperature of the workpiece W is adjusted. The lower electrode 44 is installed on the insulating member 45.

The insulating member 45 is made of an insulator such as quartz or alumina. The insulating member 45 has a substantially disc shape opened at the center. In one embodiment, the insulating member 45 has a first portion 45a and a second portion 45b. The first portion 45a is a central portion of the insulating member 45 and the second portion 44b is a portion that is further spaced apart from the first axis line AX1 than the first portion 45a, i.e., a portion extending outward of the first portion 45a. An upper surface of the first portion 45a extends downward relative to an upper surface of the second portion 45b. A lower surface of the first portion 45a extends downward relative to a lower surface of the second portion 45b. The upper surface of the second portion 44b of the insulating member 45 is brought into contact with the lower surface of the second portion 44b of the lower electrode. Meanwhile, the upper surface of the first portion 45a of the insulating member 45 is spaced apart from the lower surface of the lower electrode 44.

The shaft part 46 has a substantially cylindrical shape and is coupled to the lower surface of the lower electrode 44. Specifically, the shaft part 46 is coupled to the lower surface of the first portion 44a of the lower electrode 44. A central axis line of the shaft part 46 is aligned with the first axis line AX1. When a rotational force is applied to the shaft part 46, the holding part 40 rotates.

The holding part 40 configured by such various components forms a hollow interior space of the mounting table 14 together with the vessel 50. The vessel 50 includes a cover 50a and a body 50b. The cover 50a has a substantially disc shape. A through hole through which the shaft part 46 passes is formed at the center of the cover 50a. The cover 50a extends below the second portion 44b of the insulating member 45, and provides a slight gap between the cover 50a and the second portion 45b. Further, an upper end of the body 50b is coupled to a lower peripheral edge of the cover 50a. The body 50b has a substantially cylindrical shape with a closed lower end.

A magnetic fluid sealing part 52 is installed between the vessel 50 and the shaft part 46. The magnetic fluid sealing part 52 has an inner ring portion 52a and an outer ring portion 52b. The inner ring portion 52a has a substantially cylindrical shape extending coaxially with the shaft part 46, and is fixed to the shaft part 46. Further, an upper end of the inner ring portion 52a is coupled to the lower surface of the first portion 45a of the insulating member 45. This inner ring portion 52a is configured to rotate about the first axis line AX1 together with the shaft part 46.

The outer ring portion 52b has a substantially cylindrical shape and is installed coaxially with the inner ring portion 52a outside the inner ring portion 52a. The upper end of the outer ring portion 52b is coupled to a lower surface of the central portion of the cover 50a. A magnetic fluid 52c is interposed between the inner ring portion 52a and the outer ring portion 52b. Further, a bearing 53 is installed between the inner ring portion 52a and the outer ring portion 52b below the magnetic fluid 52c. The magnetic fluid sealing part 52 provides a sealing structure by which an internal space of the mounting table 14 is separated from the chamber 12c. In addition, the internal space of the mounting table 14 is maintained at atmospheric pressure.

In one embodiment, a member 47 and a member 48 are installed between the magnetic fluid sealing part 52 and the shaft part 46. The member 47 has a substantially cylindrical shape which extends along a portion of an outer peripheral surface of the shaft part 46, i.e., an outer peripheral surface of an upper portion of a third tubular portion 46d and an outer peripheral surface of the first portion 44a of the lower electrode 44, which will be described later. Further, an upper end of the member 47 has an awning shape and extends along the lower surface of the second portion 44b of the lower electrode 44. This member 47 is in contact with the outer peripheral surface of the upper portion of the third tubular portion 46d, the outer peripheral surface of the first portion 44a of the lower electrode 44, and the lower surface of the second portion 44b.

The member 48 has a substantially cylindrical shape which extends along the outer peripheral surface of the shaft part 46, i.e., the outer peripheral surface of the third tubular portion 46d and the outer peripheral surface of the member 47. An upper end of the member 48 has an awning shape and extends along the upper surface of the first portion 45a of the insulating member 45. The member 48 is in contact with the outer peripheral surface of the third tubular portion 46d, the outer peripheral surface of the member 47, the upper surface of the first portion 45a of the insulating member 45, and the inner peripheral surface of the inner ring portion 52a of the magnetic fluid sealing part 52. A sealing member 49a such as an O-ring may be interposed between the member 48 and the upper surface of the first portion 45a of the insulating member 45. In addition, sealing members 49b and 49c such as an O-ring may be interposed between the member 48 and the inner peripheral surface of the inner ring portion 52a of the magnetic fluid sealing part 52. This configuration seals a space defined between the shaft part 46 and the inner ring portion 52a of the magnetic fluid sealing part 52.

A pair of openings is formed along the second axis line AX2 in the body 50b of the vessel 50. Inner end portions of the pair of shaft parts 60a and 60b are inserted into the pair of openings formed in the body 50b, respectively. The pair of shaft parts 60a and 60b has a substantially cylindrical shape. A central axis line of each of the pair of shaft parts 60a and 60b is aligned with the second axis line AX2. The pair of shaft parts 60a and 60b extends outward beyond the chamber body 12. The shaft part 60a is coupled to a rotation driving device outside the chamber body 12. The rotation driving device generates power for rotating the mounting table 14 about the second axis line AX2.

Wirings for various electric systems, a pipe for heat transfer gas, and a pipe for refrigerant pass through an inner hole of the shaft part 60b. These wirings and pipes are connected to the shaft part 46.

The shaft part 46 includes a columnar portion 46a, a first tubular portion 46b, a second tubular portion 46c, and the third tubular portion 46d. The columnar portion 46a has a substantially cylindrical shape and extends along the first axis line AX1. The columnar portion 46a constitutes a wiring for applying a voltage to the electrode film of the electrostatic chuck 42. The columnar portion 46a is connected to a wiring 61 through a slip ring of a rotary connector 54. The wiring 61 extends from the internal space of the mounting table 14 to the outside of the chamber body 12 through the inner hole of the shaft part 60b. The wiring 61 is coupled to a power supply 91 (see FIG. 4) through a switch located outside of the chamber body 12.

The first tubular portion 46b is installed coaxially with the columnar portion 46a and outside the columnar portion 46a. The first tubular portion 46b constitutes a wiring for supplying the modulated DC voltage or the high-frequency bias power to the lower electrode 44. The first tubular portion 46b is connected to the wiring 62 through a separate slip ring of the rotary connector 54. The wiring 62 extends from the internal space of the mounting table 14 to the outside of the chamber body 12 through the inner hole of the shaft part 60b. The wiring 62 is connected to the first power supply 90a and the second power supply 90b of the bias power supply part 90 outside the chamber body 12. Further, the second power supply 90b is coupled to the first tubular portion 46b via a matcher for impedance matching installed outside the chamber body 12.

The second tubular portion 46c is installed coaxially with the first tubular portion 46b and outside the first tubular portion 46b. In one embodiment, a bearing 55 is installed inside the rotary connector 54. The bearing 55 extends along the outer peripheral surface of the second tubular portion 46c. The bearing 55 supports the shaft part 46 through the second tubular portion 46c. A gas line for supplying a heat transfer gas is formed in the second tubular portion 46c. This gas line is coupled to a pipe 63 via a rotary joint such as a swivel joint. The pipe 63 extends from the internal space of the mounting table 14 to the outside of the chamber body 12 through the inner hole of the shaft part 60b. The pipe 63 is connected to a source 92 (see FIG. 4) of the heat transfer gas, which is located outside the chamber body 12.

The third tubular portion 46d is installed coaxially with the second tubular portion 46c and outside the second tubular portion 46c. A supply line for supplying refrigerant to the flow passage 44f and a recovery line for recovering the refrigerant supplied to the flow passage 44f are formed in the third tubular portion 46d. The supply line is coupled to a pipe 72 via a rotary joint 70 such as a swivel joint. Further, the recovery line is coupled to a pipe 74 via the rotary joint 70. The pipe 72 and the pipe 74 extend from the internal space of the mounting table 14 to the outside of the chamber body 12 through the inner hole of the shaft part 60b. In addition, the pipe 72 and the pipe 74 are connected to a chiller unit 93 (see FIG. 4) located outside the chamber body 12.

As illustrated in FIG. 7, a rotary motor 78 is installed in the internal space of the mounting table 14. The rotary motor 78 generates power for rotating the shaft part 46. In one embodiment, the rotary motor 78 is installed at the side of the shaft part 46. The rotary motor 78 is coupled to a pulley 80 attached to the shaft part 46 via a conductive belt 82. When a rotational driving force of the rotary motor 78 is applied to the shaft part 46, the holding part 40 rotates about the first axis line AX1. Further, a wiring for supplying electric power to the rotary motor 78 is drawn out to the outside of the chamber body 12 through the inner hole of the shaft part 60b and connected to a motor power supply installed outside the chamber body 12.

As described above, the mounting table 14 is configured to provide the internal space set at atmospheric pressure and accommodate various mechanisms in the internal space. Further, the mounting table 14 is configured to draw out a wiring or a pipe for connecting mechanisms accommodated in the internal space and devices such as the power supply, the gas source, the chiller unit and the like installed outside the chamber body 12 to the outside of the chamber body 12. Further, in addition to the aforementioned wirings and pipes, a wiring for connecting the heater power supply installed outside the chamber body 12 and the heater installed in the electrostatic chuck 42 may be drawn out from the internal space of the mounting table 14 to the outside of the chamber body 12 through the inner hole of the shaft part 60b.

Hereinafter, the method MT will be described by way of an example of processing the workpiece W with the processing apparatus 10. It should be noted that the object of the method MT is not limited to the workpiece W. It should also be noted that a processing apparatus used to carry out the method MT is not limited to the processing apparatus 10.

As described above, in step ST1 of the method MT, the workpiece W is accommodated in the chamber 12c. Thereafter, the workpiece W is mounted on and held by the mounting table 14.

Subsequently, step ST2 of the method MT is executed. In step ST2, an insulating film is formed on the workpiece W. That is to say, an insulating film is formed on the surface of the protuberance portion PR. The insulating film formed in step ST2 is a nitride film.

In step ST2 of one embodiment, the angular position around the central axis line AXC of the shutter 26 in the circumferential direction is set so that the opening 26a is positioned between the target 18a and the workpiece W. A nitrogen gas is supplied from the gas supply part 13 into the chamber 12c. Further, the internal pressure of the chamber 12c is reduced by the exhaust device 15. Furthermore, a voltage is applied from the power supply 20a to the target holder 16a. As a result, plasma is generated around the target 18a, and ions in the plasma are drawn to the target 18a. When the ions collide with the target 18a, silicon constituting the target 18a is deposited on the workpiece W. The silicon deposited on the workpiece W is nitrided by active species of nitrogen. As a result, an insulating film made of silicon nitride is formed on the workpiece W.

In step ST2 of another embodiment, the angular position around the central axis line AXC of the shutter 26 in the circumferential direction is set so that the opening 26a is positioned between the target 18b and the workpiece W. A nitrogen gas is supplied from the gas supply part 13 into the chamber 12c. Further, the internal pressure of the chamber 12c is reduced by the exhaust device 15. Furthermore, a voltage is applied from the power supply 20b to the target holder 16b. As a result, plasma is generated around the target 18b, and ions in the plasma are drawn to the target 18b. When the ions collide with the target 18b, aluminum constituting the target 18b is deposited on the workpiece W. The aluminum deposited on the workpiece W is nitrided by active species of nitrogen. As a result, an insulating film made of aluminum nitride is formed on the workpiece W.

Figure 8:
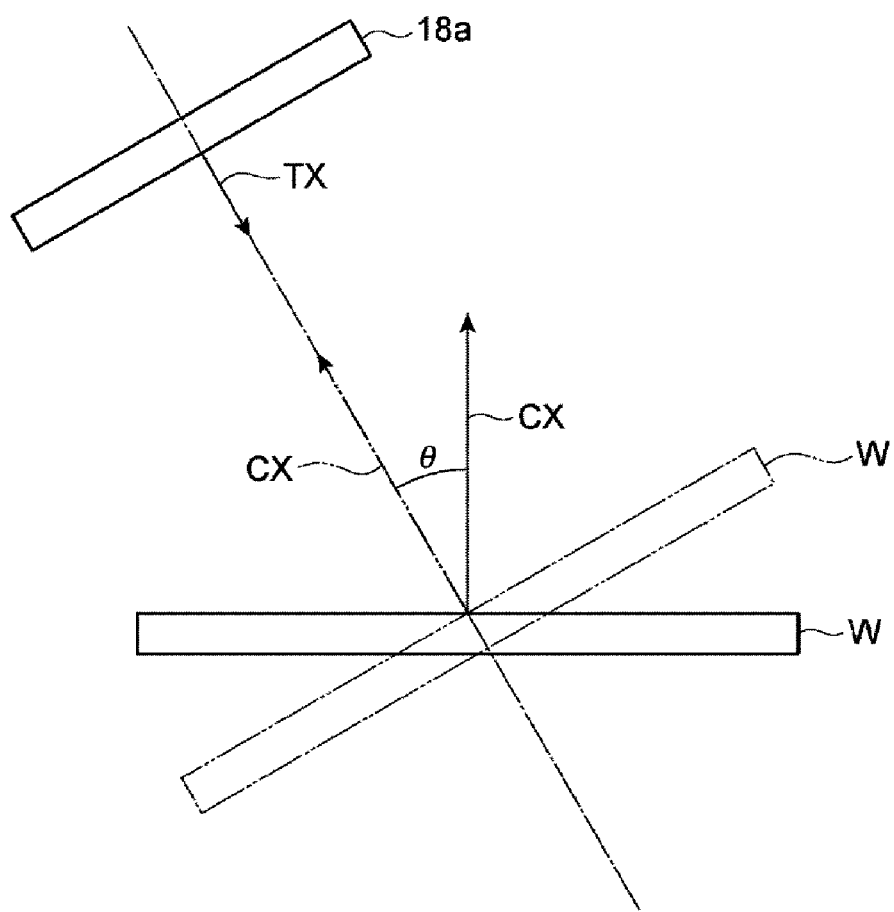
FIG. 8 is a view showing an angle defined between a workpiece and a target in step ST2 of the method shown in FIG. 1.
Figure 9:
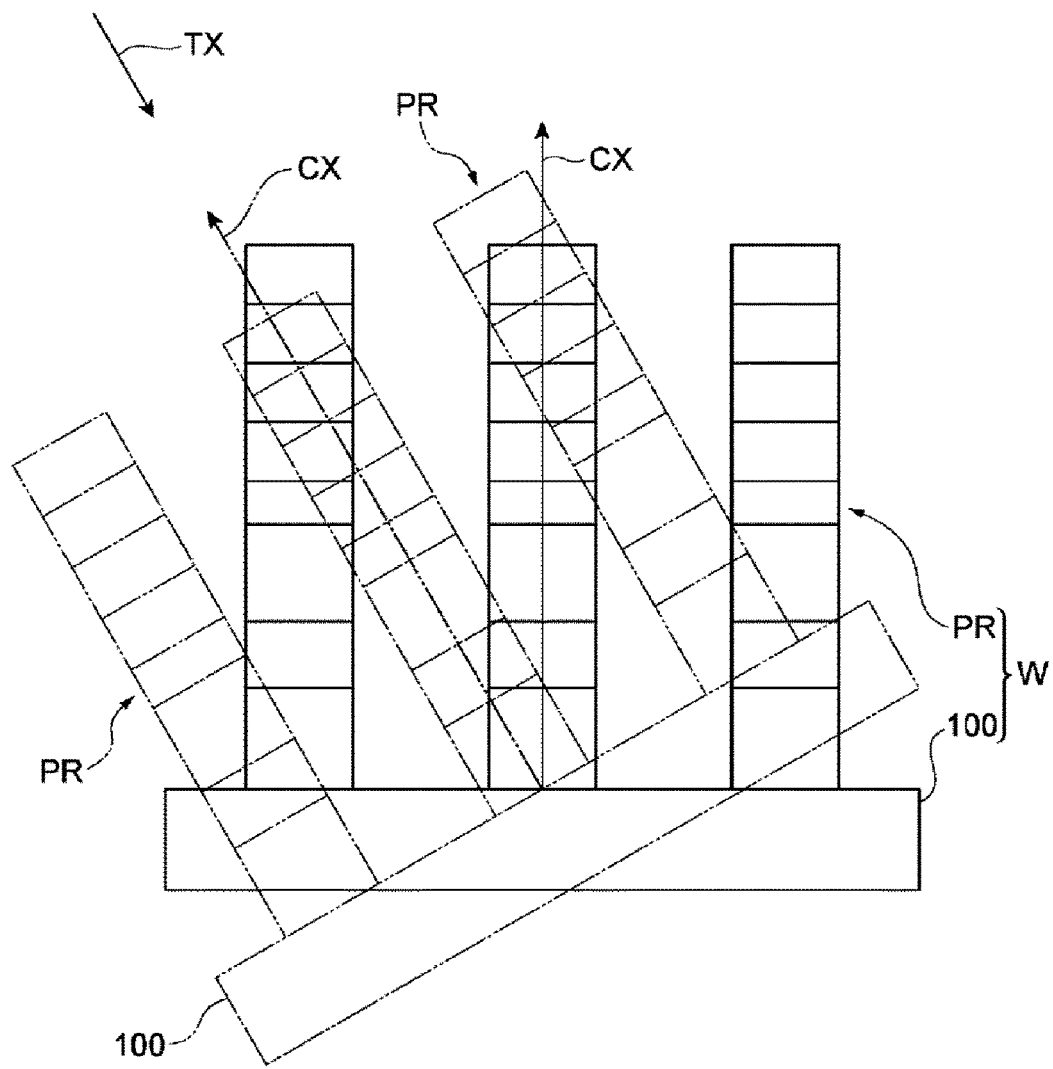
FIG. 9 is a view showing an angle defined between a workpiece and a target in step ST2 of the method shown in FIG. 1.

Hereinafter, FIGS. 8 and 9 will be referred to. FIGS. 8 and 9 are views showing an angle defined between the workpiece and the target in step ST2 of the method MT. An enlarged portion of the workpiece is shown In FIG. 9. As shown in FIGS. 8 and 9, in step ST2 of the embodiment in which the target 18a is used to form an insulating film, when the mounting table 14 is pivoted around the second axis line AX2, an angle defined between the workpiece W and the target 18a is changed during the formation of the insulating film. Specifically, an angle θ defined between the direction TX that the target 18a faces and the direction in which the central axis line CX of the workpiece W extends is changed. In one embodiment, the angle θ is changed in an angular range from 0 to 30 degrees. The direction TX is a tangential direction of a main surface of the target 18a at the first space S1 side or a plane extending along the main surface. When the angle θ is 0 degrees, the direction TX and the direction in which the central axis line CX extends are parallel to each other while being headed in the other direction. When the angle θ is larger than 0 degrees, the central axis line CX extends in a direction orthogonal to the direction TX.

In step ST2 of the embodiment in which the target 18b is used to form an insulating film, when the mounting table 14 is pivoted around the second axis line AX2, an angle defined between the workpiece W and the target 18b is changed during the formation of the insulating film. Specifically, in step ST2 of the embodiment in which the target 18b is used, an angle defined between the direction that the target 18b faces and the direction in which the central axis line of the workpiece W extends is changed in an angular range from 0 to 30 degrees, as in step ST2 of the embodiment in which the target 18a is used.

Further, in step ST2 of one embodiment, the mounting table 14 is rotated around the first axis line AX1 so that the workpiece W is rotated around the central axis line CX.

Figure 10:
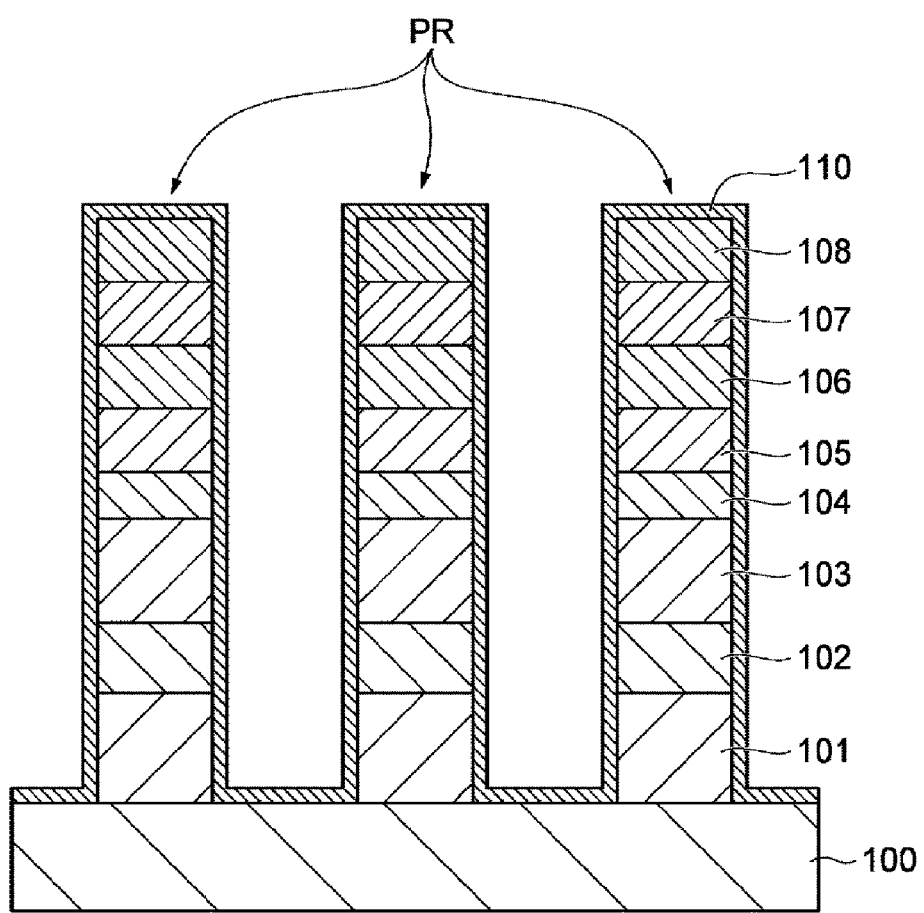
FIG. 10 is a view showing a state of a workpiece obtained by carrying out the method shown in FIG. 1.

FIG. 10 is a view showing a state of a workpiece obtained by carrying out the method shown in FIG. 1. As shown in FIG. 10, after step ST2 is executed, an insulating film 110 is formed on the surface of the workpiece W. As described above, in step ST2, the insulating film is formed while the angle defined between the workpiece W and a target used to form the insulating film is being changed. Therefore, the substance (silicon or aluminum) released from the target in step ST2 reaches not only the upper surfaces of the protuberance portions PR but also lateral surfaces of the protuberance portions PR. Therefore, according to the method MT, the coverage of the insulating film to the protuberance portions PR is improved.

Further, according to step ST2 of one embodiment, the workpiece W is rotated around the central axis line CX while the insulating film is being formed. Therefore, the substance released from the target reaches the entire lateral surfaces of the protuberance portions PR. Thus, the insulating film is uniformly formed on the entire lateral surface of the protuberance portions PR.

While various embodiments have been described above, various modifications can be made without being limited to the above-described embodiments. For example, the number of the protuberance portions of the workpiece may be a certain number of one or more. In addition, the processing apparatus 10 may not include the configurations for etching, that is to say, the window member 28, the antenna 30, the high frequency power supply 32, the matcher 34 and the bias power supply part 90.

According to the present disclosure in some embodiments, it is possible to provide a method capable of forming an insulating film on a protuberance portion with good coverage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming an insulating film, comprising:
providing, on a mounting table of a processing apparatus including a first space where a target is installed and a second space which is separated from the first space by a partition wall in a circumferential direction with respect to an axis line of the mounting table, a workpiece having a base portion and a protuberance portion formed to protrude from the base portion, the protuberance portion having a columnar shape and having an upper surface and lateral surfaces;
forming the insulating film directly on the upper surface and the entire lateral surfaces of the protuberance portion while the workpiece faces the first space, such that the insulating film is formed continuously along the upper surface and the entire lateral surfaces of the protuberance portion, by performing sputtering; and
etching the workpiece while the workpiece faces the second space,
wherein during the performing sputtering, an angle defined between the workpiece and the target varies by rotating the workpiece around the axis line of the mounting table.

2. The method of claim 1, wherein the performing sputtering includes varying an angle defined between a direction that the target faces and a direction in which the protuberance portion extends, within an angular range from 0 to 30 degrees.

3. The method of claim 1, wherein the performing sputtering includes rotating the workpiece around a central axis line of the workpiece, which is parallel to a direction in which the protuberance portion extends.

4. The method of claim 1, wherein the protuberance portion includes a magnetic tunnel junction element region constituted by a first magnetic layer, a second magnetic layer and an insulating layer interposed between the first magnetic layer and the second magnetic layer.

5. The method of claim 1, wherein the insulating film is a nitride film.

* * * * *